United States Patent
Yu

(10) Patent No.: US 11,038,149 B2
(45) Date of Patent: Jun. 15, 2021

(54) DISPLAY PANEL HAVING LIGHT-ABSORBING PHOTORESIST LAYER

(71) Applicant: Wuhan China Star Optoelectronics Semiconductor Display Technology Co., Ltd., Wuhan (CN)

(72) Inventor: Wenjing Yu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/340,143

(22) PCT Filed: Jan. 17, 2019

(86) PCT No.: PCT/CN2019/072205
§ 371 (c)(1),
(2) Date: Apr. 8, 2019

(87) PCT Pub. No.: WO2020/098151
PCT Pub. Date: May 22, 2020

(65) Prior Publication Data
US 2020/0152916 A1     May 14, 2020

(30) Foreign Application Priority Data
Nov. 13, 2018   (CN) .......................... 201811347680.9

(51) Int. Cl.
*H01L 51/52* (2006.01)
*H01L 27/32* (2006.01)

(52) U.S. Cl.
CPC ........ *H01L 51/5268* (2013.01); *H01L 27/322* (2013.01); *H01L 51/5253* (2013.01); *H01L 51/5275* (2013.01); *H01L 51/5284* (2013.01); *H01L 2251/303* (2013.01)

(58) Field of Classification Search
None
See application file for complete search history.

(56) References Cited

U.S. PATENT DOCUMENTS

| 2008/0272367 | A1* | 11/2008 | Cok | ..................... H01L 51/5268 |
| | | | | 257/40 |
| 2011/0210348 | A1* | 9/2011 | Yuasa | ................. H01L 51/5253 |
| | | | | 257/88 |
| 2012/0104372 | A1 | 5/2012 | Kim et al. | |
| 2014/0138630 | A1 | 5/2014 | Lee et al. | |

(Continued)

FOREIGN PATENT DOCUMENTS

| CN | 102468322 | 5/2012 |
| CN | 103227189 | 7/2013 |

(Continued)

*Primary Examiner* — Kevin Parendo

(57) ABSTRACT

A display panel and a mobile device are provided. The display panel includes a light-emitting substrate; and a photoresist layer disposed on the light-emitting substrate; wherein a scattering layer is disposed between the light-emitting substrate and the photoresist layer, such that light emitted by the light-emitting substrate passes through the scattering layer and exits from the photoresist layer through the scattering layer, and causes that external light passing through the photoresist layer, refracted and/or reflected by the scattering layer, is absorbed by the photoresist layer.

10 Claims, 4 Drawing Sheets

(56) References Cited

U.S. PATENT DOCUMENTS

| | | | |
|---|---|---|---|
| 2014/0145162 A1* | 5/2014 | Lin | H01L 27/323 |
| | | | 257/40 |
| 2015/0145405 A1 | 5/2015 | Yanget et al. | |
| 2016/0211487 A1 | 7/2016 | Choi et al. | |
| 2016/0334553 A1 | 11/2016 | Wu et al. | |
| 2017/0098690 A1* | 4/2017 | Lee | H01L 51/0034 |
| 2017/0170433 A1* | 6/2017 | Fang | H01L 51/5253 |
| 2017/0309859 A1* | 10/2017 | Lee | H01L 27/3218 |
| 2018/0088404 A1 | 3/2018 | Chae et al. | |
| 2019/0189728 A1* | 6/2019 | Lee | H01L 27/322 |

FOREIGN PATENT DOCUMENTS

| | | |
|---|---|---|
| CN | 103839962 | 6/2014 |
| CN | 104009062 | 8/2014 |
| CN | 104157669 | 11/2014 |
| CN | 104538427 | 4/2015 |
| JP | 2009-087860 | 4/2009 |
| KR | 2018-0025466 | 3/2018 |

* cited by examiner

DISPLAY PANEL HAVING LIGHT-ABSORBING PHOTORESIST LAYER

RELATED APPLICATIONS

This application is a National Phase of PCT Patent Application No. PCT/CN2019/072205 having International filing date of Jan. 17, 2019, which claims the benefit of priority of Chinese Patent Application No. 201811347680.9 filed on Nov. 13, 2018. The contents of the above applications are all incorporated by reference as if fully set forth herein in their entirety.

FIELD AND BACKGROUND OF THE INVENTION

The present invention relates to a field of display technologies, and more particularly, to a display panel and a mobile device.

In recent years, because organic light emitting diodes (OLEDs) have features such as self-illumination, low energy consumption, wide viewing angles, rich colors, fast response, and abilities to be fabricated as flexible screens, etc., OLEDs have attracted great interest from scientific research and industry, and have been considered to be a promising next-generation display technology.

In the prior art, a polarizer (POL) is attached to the top of the screens in order to enhance the contrast of the display. However, the polarizer absorbs most of light emitted by OLEDs while absorbing external sunlight. This leads to a lower luminous efficiency of OLEDs. Therefore, the prior art has drawbacks and is in urgent need of improvement.

SUMMARY OF THE INVENTION

The present application provides a display panel and a mobile device, which can effectively improve the light efficiency and contrast of the display panel.

In first aspect, the present application provides a display, comprising:
 a light-emitting substrate; and
 a photoresist layer disposed on the light-emitting substrate;
 wherein a scattering layer is disposed between the light-emitting substrate and the photoresist layer, light emitted by the light-emitting substrate passes through the scattering layer and exits from the photoresist layer, and external light passing through the photoresist layer, refracted and/or reflected by the scattering layer, is absorbed by the photoresist layer.

In the display panel of the present application, an encapsulation film layer is disposed between the light-emitting substrate and the scattering layer for the light entering the scattering layer through the encapsulation film layer, to reduce an incident angle of the light entering the scattering layer.

In the display panel of the present application, the photoresist layer comprises a plurality of color filters and a plurality of black matrices, the color filters and the black matrices are arranged alternately for forming a plurality of light regions on the color filters, wherein the light passing through the scattering layer exits from the light region, and the external light passing through the light region, refracted and/or reflected by the scattering layer, is absorbed by the black matrices.

In the display panel of the present application, the refractive index of the color filter is greater than the refractive index of the scattering layer and the refractive index of the scattering layer is greater than the refractive index of the encapsulation film layer, such that the light sequentially passes through the encapsulation film layer, the scattering layer, and the light region of the color filter, and exits from the light region.

In the display panel of the present application, the encapsulation film layer is composed of silicon oxynitride.

In the display panel of the present application, the light-emitting substrate comprises a plurality of sub-pixels of a plurality of organic light emitting diode (OLED) devices, the light region is disposed opposite to one of the sub-pixels of the OLED devices, and the color of the sub-pixels disposed opposite to the light region is same as the color of the color filters corresponding to the light region.

In the display panel of the present application, the color of the sub-pixels of the OLED devices comprises three colors of red, green, and blue, and the color of the color filters corresponding to the light region is one of the three colors of red, green and blue.

In the display panel of the present application, the encapsulation film layer comprises a plurality of sub-encapsulation film layers, and one of the sub-encapsulation film layers is disposed opposite to one of the sub-pixels of the OLED devices.

In the display panel of the present application, the horizontal width of the sub-encapsulation film layer is same as the horizontal width of the sub-pixel of the OLED device.

In the display panel of the present application, a water/oxygen barrier layer is disposed between the sub-encapsulation film layers for blocking water and oxygen from entering the display panel.

In second aspect, the application further provides a mobile device, comprising a housing and a display panel, the display panel is mounted on the housing and the display panel comprises:
 a light-emitting substrate; and
 a photoresist layer disposed on the light-emitting substrate;
 wherein a scattering layer is disposed between the light-emitting substrate and the photoresist layer, light emitted by the light-emitting substrate passes through the scattering layer and exits from the photoresist layer, and external light passing through the photoresist layer, refracted and/or reflected by the scattering layer, is absorbed by the photoresist layer.

In the mobile device of the present application, an encapsulation film layer is disposed between the light-emitting substrate and the scattering layer for the light entering the scattering layer through the encapsulation film layer, to reduce an incident angle of the light entering the scattering layer.

In the mobile device of the present application, the photoresist layer comprises a plurality of color filters and a plurality of black matrices, the color filters and the black matrices are arranged alternately for forming a plurality of light regions on the color filters, wherein the light passing through the scattering layer exits from the light region, and the external light passing through the light region, refracted and/or reflected by the scattering layer, is absorbed by the black matrices.

In the mobile device of the present application, the refractive index of the color filter is greater than the refractive index of the scattering layer and the refractive index of the scattering layer is greater than the refractive index of the encapsulation film layer, such that the light sequentially passes through the encapsulation film layer, the scattering layer, and the light region of the color filter, and exits from the light region.

In the mobile device of the present application, the encapsulation film layer is composed of silicon oxynitride.

In the mobile device of the present application, the light-emitting substrate comprises a plurality of sub-pixels of a plurality of organic light emitting diode (OLED) devices, the light region is disposed opposite to one of the sub-pixels of the OLED devices, and the color of the sub-pixels disposed opposite to the light region is same as the color of the color filters corresponding to the light region.

In the mobile device of the present application, the color of the sub-pixels of the OLED devices comprises three colors of red, green, and blue, and the color of the color filters corresponding to the light region is one of the three colors of red, green and blue.

In the mobile device of the present application, the encapsulation film layer comprises a plurality of sub-encapsulation film layers, and one of the sub-encapsulation film layers is disposed opposite to one of the sub-pixels of the OLED devices.

In the mobile device of the present application, a water/oxygen barrier layer is disposed between the sub-encapsulation film layers for blocking water and oxygen from entering the display panel.

In third aspect, the application further provides a display panel, comprising:

a light-emitting substrate; and a photoresist layer disposed on the light-emitting substrate;

wherein a scattering layer is disposed between the light-emitting substrate and the photoresist layer, light emitted by the light-emitting substrate passes through the scattering layer and exits from the photoresist layer, and external light passing through the photoresist layer, refracted and/or reflected by the scattering layer, is absorbed by the photoresist layer, wherein an encapsulation film layer is disposed between the light-emitting substrate and the scattering layer for the light entering the scattering layer through the encapsulation film layer, to gradually reduce an incident angle of the light entering the encapsulation film layer, of the light entering the scattering layer, and of the light entering the photoresist layer, wherein light emitted by the light-emitting substrate sequentially enters the encapsulation film layer, the scattering layer, and the photoresist layer.

The beneficial effect: the display panel provided by the present application comprises a light-emitting substrate, and a photoresist layer disposed on the light-emitting substrate. Wherein a scattering layer is disposed between the light-emitting substrate and the photoresist layer, light emitted by the light-emitting substrate passes through the scattering layer and exits from the photoresist layer, and external light passing through the photoresist layer, refracted and/or reflected by the scattering layer, is absorbed by the photoresist layer. Thereby, the luminous efficiency and the contrast of the display panel can be improved.

BRIEF DESCRIPTION OF THE SEVERAL VIEWS OF THE DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DESCRIPTION OF SPECIFIC EMBODIMENTS OF THE INVENTION

Figure 1:
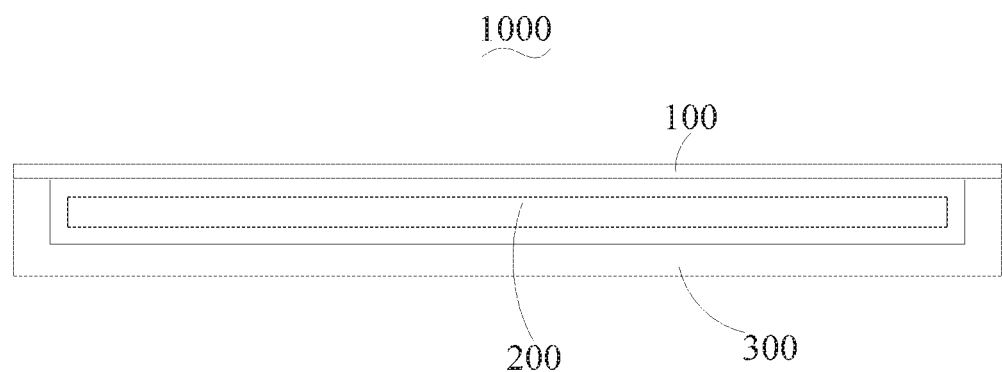
FIG. 1 is a schematic structural diagram of a mobile device according to an embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of the present application, it is to be understood that the terms "center", "longitudinal", "transverse", "length", "width", "thickness", "upper", "lower", "front", "Orientations of "post", "left", "right", "vertical", "horizontal", "top", "bottom", "inside", "outside", "clockwise", "counterclockwise", etc. The positional relationship is based on the orientation or positional relationship shown in the drawings, and is merely for the convenience of describing the present application and the simplified description, and does not indicate or imply that the device or component referred to has a specific orientation, and is constructed and operated in a specific orientation. Therefore, it should not be construed as limiting the application. Moreover, the terms "first" and "second" are used for descriptive purposes only and are not to be construed as indicating or implying a relative importance or implicitly indicating the number of technical features indicated. Thus, features defining "first" or "second" may include one or more of the described features either explicitly or implicitly. In the description of the present application, the meaning of "a plurality" is two or more unless specifically and specifically defined otherwise.

In the description of the present application, it should be noted that the terms "installation", "connected", and "connected" are to be understood broadly, and may be fixed or detachable, for example, unless otherwise explicitly defined and defined. Connected, or integrally connected; may be mechanically connected, may be electrically connected or may communicate with each other; may be directly connected, or may be indirectly connected through an intermediate medium, may be internal communication of two elements or interaction of two elements relationship. For those skilled in the art, the specific meanings of the above terms in the present application can be understood on a case-by-case basis.

In the present application, the first feature "on" or "under" the second feature may include direct contact of the first and second features, and may also include first and second features, unless otherwise specifically defined and defined. It is not in direct contact but through additional features between them. Moreover, the first feature "above", "above" and "above" the second feature includes the first feature directly above and above the second feature, or merely indicating that the first feature level is higher than the second feature. The first feature "below", "below" and "below" the second feature includes the first feature directly below and below the second feature, or merely the first feature level being less than the second feature.

The following disclosure provides many different embodiments or examples for implementing the different structures of the present application. In order to simplify the disclosure of the present application, the components and settings of the specific examples are described below. Of course, they are merely examples and are not intended to limit the application. In addition, the present application may repeat reference numerals and/or reference numerals in different examples, which are for the purpose of simplicity and clarity, and do not indicate the relationship between the various embodiments and/or arrangements discussed. Moreover, the present application provides examples of various specific processes and materials, but one of ordinary skill in the art will recognize the use of other processes and/or the use of other materials.

The embodiment of the present application provides a display panel and a mobile device, and the display panel can be integrated into a mobile device, which can be a smart wearable device, a smart phone, a tablet computer, a smart TV, and the like.

In the prior art, a polarizer (POL) is attached to the top of screens in order to enhance the contrast of the display. However, the polarizer absorbs most of light emitted by organic light emitting diodes (OLEDs) while absorbing external sunlight. This leads to a lower luminous efficiency of OLEDs. The present application provides a display panel, a scattering layer is disposed between a light-emitting substrate and a photoresist layer, light emitted by the light-emitting substrate passes through the scattering layer and exits from the photoresist layer, and external light passing through the photoresist layer, refracted and/or reflected by the scattering layer, is absorbed by the photoresist layer. Thereby, the luminous efficiency and the contrast of the display panel can be improved.

The application further provides a mobile device, comprising a housing and a display panel, the display panel is mounted on the housing and the display panel comprises:
    a light-emitting substrate; and
    a photoresist layer disposed on the light-emitting substrate;
    Wherein a scattering layer is disposed between the light-emitting substrate and the photoresist layer, light emitted by the light-emitting substrate passes through the scattering layer and exits from the photoresist layer, and external light passing through the photoresist layer, refracted and/or reflected by the scattering layer, is absorbed by the photoresist layer.

In which, an encapsulation film layer is disposed between the light-emitting substrate and the scattering layer for the light entering the scattering layer through the encapsulation film layer, to reduce an incident angle of the light entering the scattering layer.

In which, the photoresist layer comprises a plurality of color filters and a plurality of black matrices, the color filters and the black matrices are arranged alternately for forming a plurality of light regions on the color filters, wherein the light passing through the scattering layer exits from the light region, and the external light passing through the light region, refracted and/or reflected by the scattering layer, is absorbed by the black matrices.

In which, a refractive index of the color filter is greater than a refractive index of the scattering layer and the refractive index of the scattering layer is greater than a refractive index of the encapsulation film layer, such that the light sequentially passes through the encapsulation film layer, the scattering layer, and the light region of the color filter, and exits from the light region.

In which, the encapsulation film layer is composed of silicon oxynitride.

In which, the light-emitting substrate comprises a plurality of sub-pixels of a plurality of OLED devices, the light region is disposed opposite to one of the sub-pixels of the OLED devices, and the color of the sub-pixels disposed opposite to the light region is same as the color of the color filters corresponding to the light region.

In which, the color of the sub-pixels of the OLED devices comprises three colors of red, green, and blue, and the color of the color filters corresponding to the light region is one of the three colors of red, green, and blue.

In which, the encapsulation film layer comprises a plurality of sub-encapsulation film layers, and one of the sub-encapsulation film layers is disposed opposite to one of the sub-pixels of the OLED devices.

In which, a water/oxygen barrier layer is disposed between the sub-encapsulation film layers for blocking water and oxygen from entering the display panel.

Please refer to FIG. 1, FIG. 1 is a schematic structural diagram of a mobile device 1000 according to an embodiment of the present application. The mobile device 100 may include a display panel 100, a control circuit 200, and a housing 300. It should be noted that the mobile device 1000 shown in FIG. 1 is not limited to the above content, and may further include other devices, such as a camera, an antenna structure, a fingerprint unlocking module, and the like.

The display panel 100 is disposed on the housing 300.

In some embodiments, the display panel 100 may be fixed to the housing 200, the display panel 100 and the housing 300 form a hermetic space to accommodate devices such as the control circuit 200.

In some embodiments, the housing 300 may be made of a flexible material, such as a plastic housing or a silicone housing.

The control circuit 200 is mounted in the housing 300, and the control circuit 200 may be a motherboard of the mobile device 1000. The control circuit 200 may integrate one, two or more of a battery, an antenna structure, a microphone, a speaker, a headphone interface, a universal serial bus interface, a camera, a distance sensor, an ambient light sensor, a receiver, and a processor.

The display panel 100 is mounted in the housing 300. At the same time, the display panel 100 is electrically connected to the control circuit 200 to form a display surface of the mobile device 1000. The display panel 100 may include a display area and a non-display area. The display area can be used to show a screen of the mobile device 1000 or for users to perform touch manipulation and the like. The non-display area can be used to dispose various functional components.

The application further provides a display, comprising:
a light-emitting substrate; and
a photoresist layer disposed on the light-emitting substrate;
Wherein a scattering layer is disposed between the light-emitting substrate and the photoresist layer, light emitted by the light-emitting substrate passes through the scattering layer and exits from the photoresist layer, and external light passing through the photoresist layer, refracted and/or reflected by the scattering layer, is absorbed by the photoresist layer.

In which, an encapsulation film layer is disposed between the light-emitting substrate and the scattering layer for the light entering the scattering layer through the encapsulation film layer, to reduce an incident angle of the light entering the scattering layer.

In which, the photoresist layer comprises a plurality of color filters and a plurality of black matrices, the color filters and the black matrices are arranged alternately for forming a plurality of light regions on the color filters, wherein the light passing through the scattering layer exits from the light region, and the external light passing through the light region, refracted and/or reflected by the scattering layer, is absorbed by the black matrices.

In which, the refractive index of the color filter is greater than the refractive index of the scattering layer and the refractive index of the scattering layer is greater than refractive index of the encapsulation film layer, such that the light sequentially passes through the encapsulation film layer, the scattering layer, and the light region of the color filter, and exits from the light region.

In which, the encapsulation film layer is composed of silicon oxynitride.

In which, the light-emitting substrate comprises a plurality of sub-pixels of a plurality of OLED devices, the light region is disposed opposite to one of the sub-pixels of the OLED devices, and the color of the sub-pixels disposed opposite to the light region is same as the color of the color filters corresponding to the light region.

In which, the color of the sub-pixels of the OLED devices comprises three colors of red, green, and blue, and the color of the color filters corresponding to the light region is one of the three colors of red, green and blue.

In which, the encapsulation film layer comprises a plurality of sub-encapsulation film layers, and one of the sub-encapsulation film layers is disposed opposite to one of the sub-pixels of the OLED devices.

In which, the horizontal width of the sub-encapsulation film layer is same as the horizontal width of the sub-pixel of the OLED device.

In which, a water/oxygen barrier layer is disposed between the sub-encapsulation film layers for blocking water and oxygen from entering the display panel.

Figure 2:
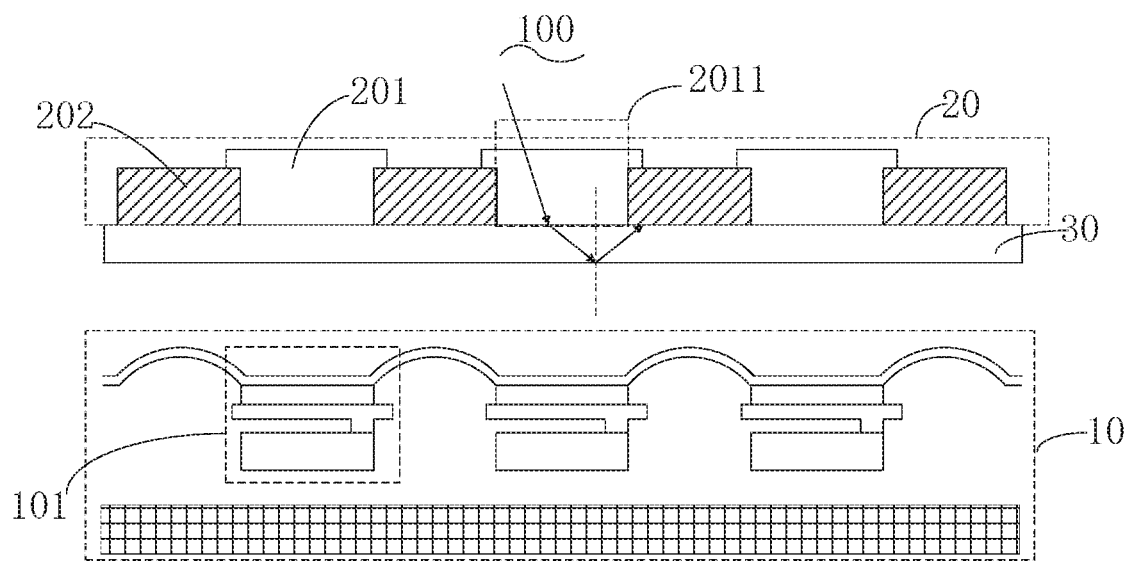
FIG. 2 is a schematic structural diagram of a display panel according to an embodiment of the present application.
Figure 3:
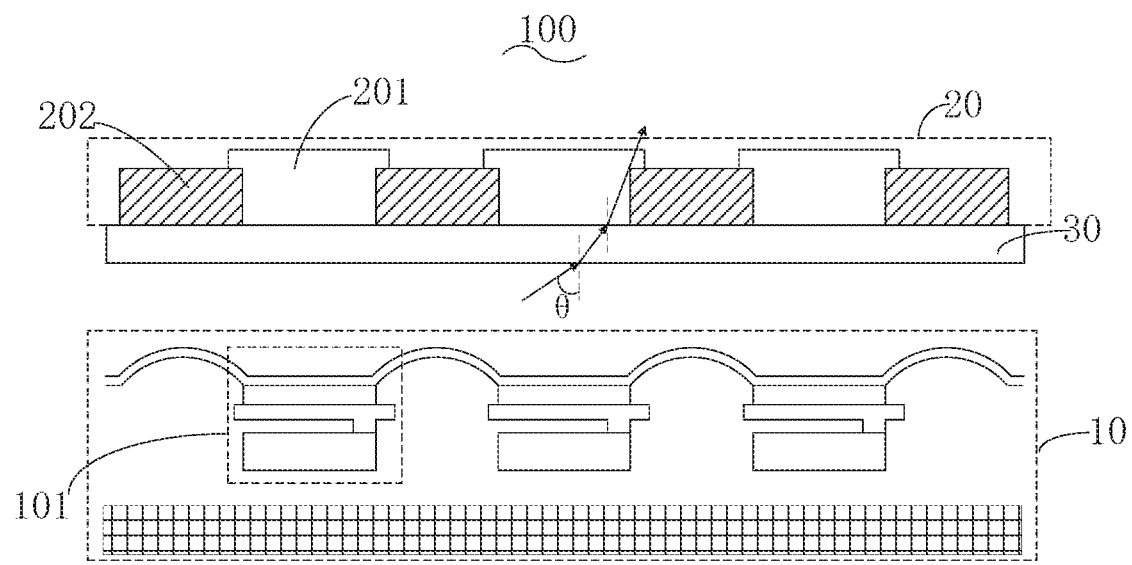
FIG. 3 is a schematic structural diagram of the display panel according to another embodiment of the present application.

Further, please refer to FIG. 2 and FIG. 3, FIG. 2 is a schematic structural diagram of a display panel according to an embodiment of the present application, and FIG. 3 is a schematic structural diagram of the display panel according to another embodiment of the present application.

In which, the display panel 100 includes a light-emitting substrate 10 and a photoresist layer 20 disposed on the light-emitting substrate 10, wherein a scattering layer 30 is further disposed between the light-emitting substrate 10 and the photoresist layer 20, light emitted by the light-emitting substrate 10 passes through the scattering layer 30 and exits from the photoresist layer 20, and external light passing through the photoresist layer 20, refracted and/or reflected by the scattering layer 30, is absorbed by the photoresist layer 20.

It should be understood that the light emitted by the light-emitting substrate 10 is refracted and changed its original incident angle by the scattering layer 30, and the light enters the photoresist layer 20, the refracted and/or reflected light exits to the outside of the display panel 100 via the photoresist layer 20. Moreover, after the external light enters to the scattering layer 30 via the photoresist layer 20, the external light may be refracted and/or reflected into the photoresist layer 20 by the scattering layer 30, and be absorbed by the photoresist layer 20.

In some embodiments, the photoresist layer 20 comprises a plurality of color filters 201 and a plurality of black matrices 202, the color filters 201 and the black matrices 202 are arranged alternately for forming a plurality of light regions 2011 on the color filters 201, wherein the light passing through the scattering layer 30 exits from the light region 2011, and the external light passing through the light region 2011, refracted and/or reflected by the scattering layer 30, is absorbed by the black matrices 202.

In which, the color filters 201 are used to filter out other colors of the light emitted by the light-emitting substrate 10, and only passes the color corresponding to the color filters 201. The black matrices 202 are used to absorb the external light, and the external light may include some light that is emitted from the outside into the display panel 100, such as sunlight.

Figure 4:
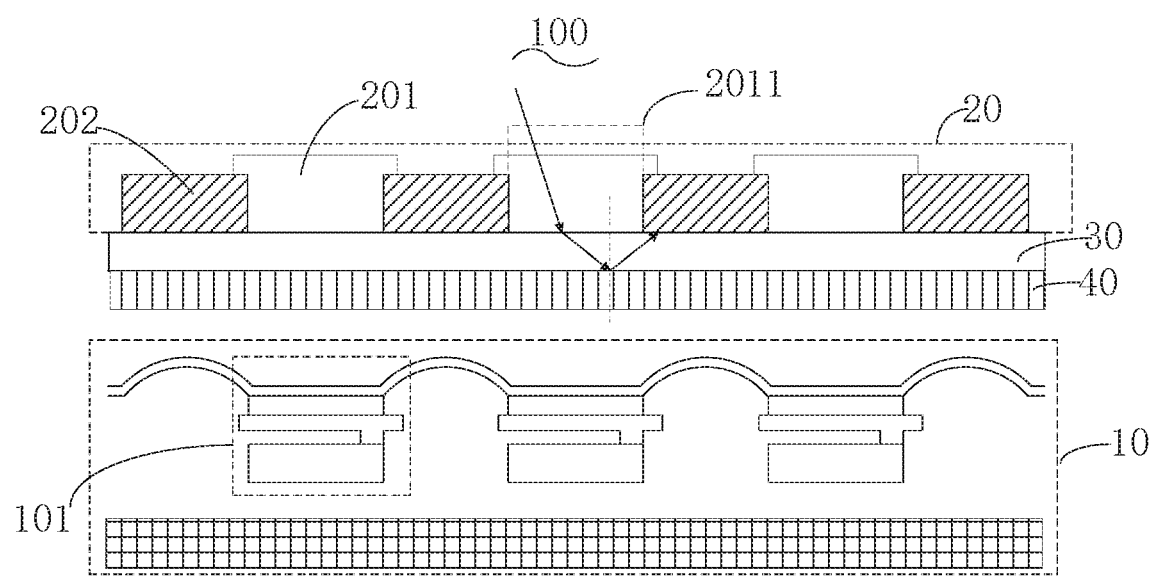
FIG. 4 is a schematic structural diagram of the display panel according to still another embodiment of the present application.
Figure 5:
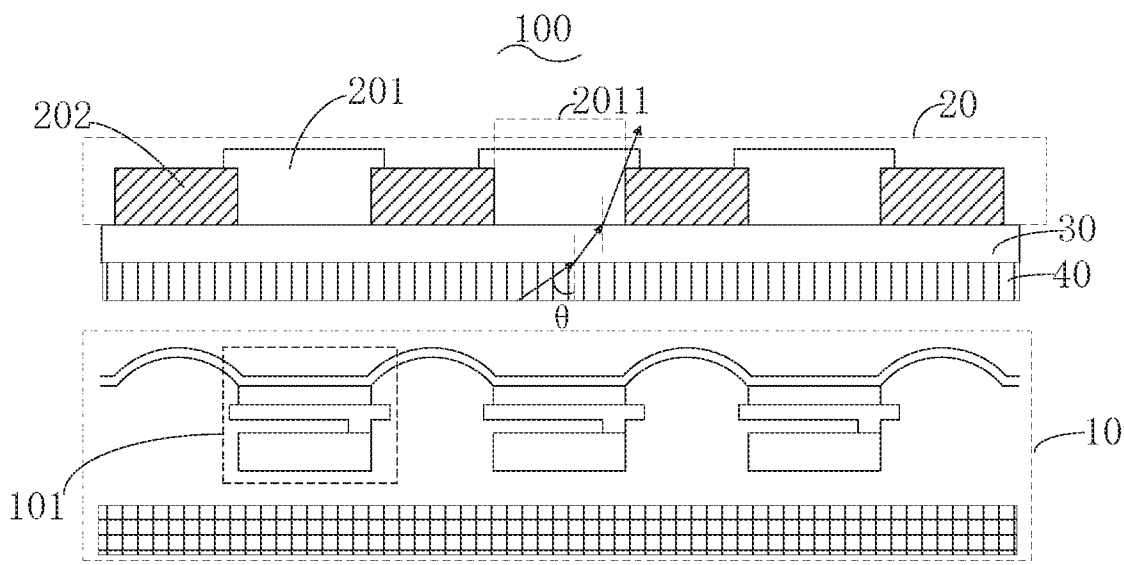
FIG. 5 is a schematic structural diagram of the display panel according to still another embodiment of the present application.

In some embodiments, please refer to FIG. 4 and FIG. 5, FIG. 4 is a schematic structural diagram of the display panel according to still another embodiment of the present application, and FIG. 5 is a schematic structural diagram of the display panel according to still another embodiment of the present application. The difference between FIGS. 4, 5 and FIGS. 2, 3 is that an encapsulation film layer 40 is disposed between the light-emitting substrate 10 and the scattering layer 30 for the light entering the scattering layer 30 through the encapsulation film layer 40, to reduce an incident angle θ of the light entering the scattering layer 30.

In which, the encapsulation film layer 40 may be processed by chemical vapor deposition (CVD), the encapsulation film layer 40 can protect the light-emitting substrate 10, and a compound of the light-emitting substrate 10 may also change the path of the light emitted by the light-emitting substrate 10. When the light exits from the encapsulation film layer 40 and enters to the scattering layer 30, the incident angle θ of the light entering to the scattering layer 30 can be reduced.

In which, the photoresist layer 20 comprises a plurality of color filters 201 and a plurality of black matrices 202, the color filters 201 and the black matrices 202 are arranged alternately for forming a plurality of light regions 2011 on the color filters 201, wherein the light passing through the scattering layer 30 exits from the light region 2011, and the external light passing through the light region 2011, refracted and/or reflected by the scattering layer 30, is absorbed by the black matrices 202.

In which, the color filters 201 are used to filter out other colors of the light emitted by the light-emitting substrate 10, and only passes the color corresponding to the color filters 201. The black matrices 202 are used to absorb the external light, and the external light may include some light that is emitted from the outside into the display panel 100, such as sunlight.

In some embodiments, the refractive index of the color filter 201 is greater than the refractive index of the scattering layer 30 and the refractive index of the scattering layer 30 is greater than the refractive index of the encapsulation film layer 40, such that the light sequentially passes through the encapsulation film layer 40, the scattering layer 30, and the light region 2011 of the color filter 201, and exits from the light region 2011. When the above-mentioned refractive conditions are satisfied, the light emitted by the light-emitting substrate 10 sequentially passes through the encapsulation film layer 40, the scattering layer 30, and the color filter 201, the incident angle of the light emitted by the light-emitting substrate 10 into each layer is gradually reduced, so that the light emitted by the light-emitting substrate 10 can exit as much as possible outside the display panel 100.

In some embodiments, the encapsulation film layer 40 is composed of silicon oxynitride.

Generally, the encapsulation film layer 40 is usually made of silicon nitride, a kind of inorganic materials, and the refractive index of silicon nitride is 1.8-1.9. However, the refractive index of the color filters 201 is 1.6-1.7. It is difficult to satisfy those refractive conditions which are the refractive index of the color filter 201 is greater than the refractive index of the scattering layer 30 and the refractive index of the scattering layer 30 is greater than the refractive index of the encapsulation film layer 40. Therefore, in the embodiment of the present application, the inorganic material in the encapsulation film layer 40 may be replaced by silicon oxynitride, the refractive index of the silicon oxynitride is about 1.49-1.51, and the light transmittance of the silicon oxynitride is also higher than that of the silicon nitride.

Figure 6:
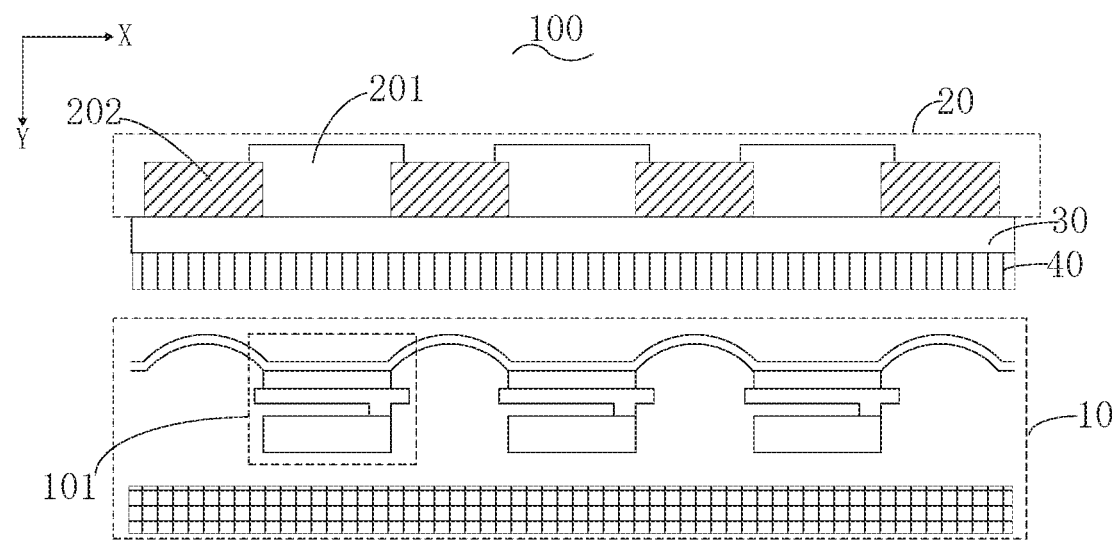
FIG. 6 is a schematic structural diagram of the display panel according to still another embodiment of the present application.

In some embodiments, as shown in FIG. 6, FIG. 6 is a schematic structural diagram of the display panel according to still another embodiment of the present application.

The light-emitting substrate 10 includes a plurality of sub-pixels 101 of a plurality of organic light emitting diode (OLED) devices, the light region 2011 is disposed opposite to one of the sub-pixels 101 of the OLED devices, and the color of the sub-pixels 101 disposed opposite to the light region is same as the color of the color filters 201 corresponding to the light region 2011.

In some embodiments, the color of the sub-pixels 101 of the OLED devices comprises three colors of red, green, and blue, and the color of the color filters corresponding to the light region 2011 is one of the three colors of red, green and blue.

In which, the sub-pixel 101 on the OLED device includes three colors of red, green, and blue, and the OLED device emits light corresponding to the color of the sub-pixel 101 by the light emitting layer of the OLED device. And, the color filter 201 corresponding to the color of the sub-pixel 101 is provided along the negative direction of the Y-axis, that is, the red sub-pixel 101 corresponds to the red color filter 201, the green sub-pixel 101 corresponds to the green color filter 201, and the blue sub-pixel 101 corresponds to the blue color filter 201. For example, in same Y-axis direction, if the color of the sub-pixel 101 is red, then the corresponding color filter 201 can only pass the red light, and the light of other colors will be filtered out. Therefore, the sub-pixel 101 on the OLED device and the color filter 201 corresponding to the color of the sub-pixel 101 are disposed in same Y-axis direction.

Specifically, the OLED device includes an anode, a hole transport layer, a light emitting layer, an electron transport layer, and a cathode (neither shown in the drawing). When an appropriate voltage is supplied by a power, the positive hole and the cathode charge are combined in the light emitting layer to produce light, thereby producing the three primary colors, which are red, green, and blue.

The display panel 100 provided by the embodiment of the present application, includes a light-emitting substrate 10 and a photoresist layer 20 disposed on the light-emitting substrate 10, wherein a scattering layer 30 is further disposed between the light-emitting substrate 10 and the photoresist layer 20, light emitted by the light-emitting substrate 10 passes through the scattering layer 30 and exits from the photoresist layer 20, and external light passing through the photoresist layer 20, refracted and/or reflected by the scattering layer 30, is absorbed by the photoresist layer 20. Thereby, the luminous efficiency and the contrast of the display panel 100 can be improved.

Figure 7:
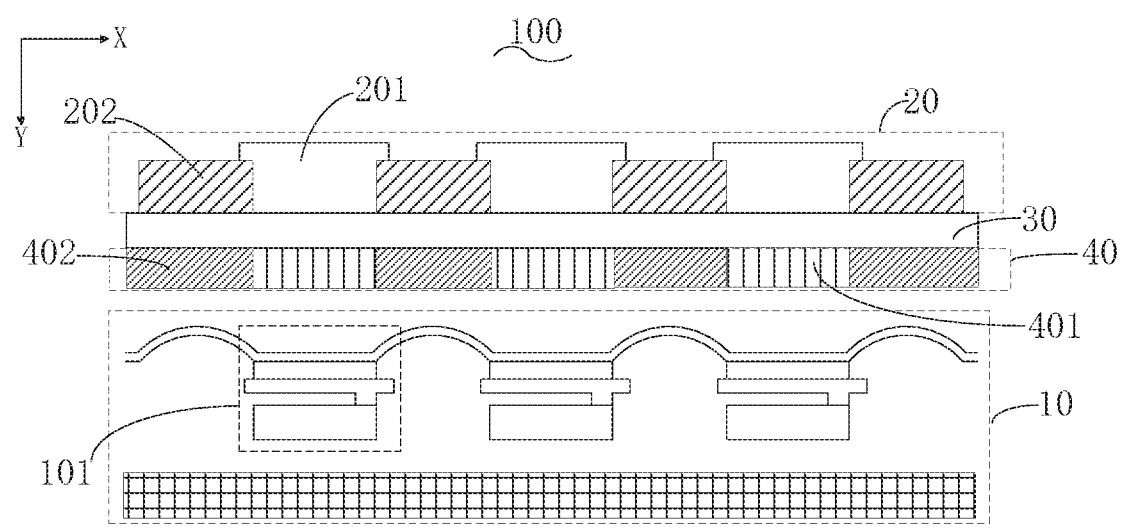
FIG. 7 is a schematic structural diagram of the display panel according to still another embodiment of the present application.

Further, as shown in FIG. 7, FIG. 7 is a schematic structural diagram of the display panel according to still another embodiment of the present application.

In some embodiments, wherein the encapsulation film layer 40 is divided into a plurality of sub-encapsulation film layers 401, and one of the sub-encapsulation film layers 401 is disposed opposite to one of the sub-pixels 101 of the OLED devices.

In some embodiments, a water/oxygen barrier layer 401 is disposed between the sub-encapsulation film layers 402 for blocking water and oxygen from entering the display panel 100.

Since light is emitted through the sub-pixel 101 of the OLED device, it is not necessary to provide an inorganic material at a position other than the sub-pixel 101 in the Y-axis direction. Therefore, the sub-encapsulation film layer 401 equal to the width of the sub-pixel 101 on the X-axis can be disposed above the sub-pixel 101 in the negative direction of the Y-axis, wherein the width of the encapsulation film layer 401 on the X-axis may also be greater than the width of the sub-pixel 101 on the X-axis. Moreover, in order to prevent water and oxygen from entering the encapsulation film layer 40 in the process, the water/oxygen barrier layer 402 may be disposed between the sub-encapsulation film layers 401 to prevent water and oxygen from entering the display panel 100.

The display panel 100 provided by the embodiment of the present application, includes a light-emitting substrate 10 and a photoresist layer 20 disposed on the light-emitting substrate 10, wherein a scattering layer 30 is further disposed between the light-emitting substrate 10 and the photoresist layer 20, light emitted by the light-emitting substrate 10 passes through the scattering layer 30 and exits from the photoresist layer 20, and external light passing through the photoresist layer 20, refracted and/or reflected by the scattering layer 30, is absorbed by the photoresist layer 20. Thereby, the luminous efficiency and the contrast of the display panel 100 can be improved, and water and oxygen can effectively be prevented from entering the display panel 100.

The application further provides a display panel, comprising:
a light-emitting substrate 10; and
a photoresist layer 20 disposed on the light-emitting substrate 20;

Wherein a scattering layer 30 is further disposed between the light-emitting substrate 10 and the photoresist layer 20, light emitted by the light-emitting substrate 10 passes through the scattering layer 30 and exits from the photoresist layer 20, and external light passing through the photoresist layer 20, refracted and/or reflected by the scattering layer 30, is absorbed by the photoresist layer 20, wherein an encapsulation film layer 40 is disposed between the light-emitting substrate 10 and the scattering layer 30 for the light entering the scattering layer 30 through the encapsulation film layer 40, to gradually reduce an incident angle of the light entering the encapsulation film layer 40, of the light entering the scattering layer 30, and of the light entering the photoresist layer 20, wherein light emitted by the light-emitting substrate 10 sequentially enters the encapsulation film layer 40, the scattering layer 30, and the photoresist layer 20.

In order to further describe the present application, the following description will be made in the direction of the method of manufacturing the display panel.

Providing a light-emitting substrate, forming a photoresist layer on the light-emitting substrate;

Wherein forming a scattering layer between the light-emitting substrate and the photoresist layer, such that light emitted by the light-emitting substrate passes through the scattering layer and exits from the photoresist layer, and external light passing through the photoresist layer, refracted and/or reflected by the scattering layer, is absorbed by the photoresist layer.

The method for manufacturing the display panel provided by the embodiment of the present application is applied to a mobile device. The scattering layer disposed in the display panel for reducing the incident angle of the light emitted by the light-emitting substrate into each layer, and refracting and/or reflecting the external light to the photoresist layer for absorption, thereby improving the luminous efficiency and the contrast of the display panel.

In the above embodiments, the descriptions of the various embodiments are different, and the details that are not detailed in a certain embodiment can be referred to the related descriptions of other embodiments.

The display panel and the mobile device provided by the embodiments of the present application are described in detail. The principles and implementations of the present application are described in the specific examples. The description of the above embodiments is only used to help understand the present application. Technical solution and its core idea; those of ordinary skill in the art should understand that it can still modify the technical solutions described in the foregoing embodiments, or replace some of the technical features; and these modifications or replacements The essence of the corresponding technical solutions is not deviated from the scope of the technical solutions of the embodiments of the present application.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A display panel, comprising:
   a light-emitting substrate; and
   a photoresist layer disposed on the light-emitting substrate, wherein the photoresist layer comprises
      a plurality of color filters and
      a plurality of black matrices,
      the color filters and the black matrices are arranged alternately for forming a plurality of light regions on the color filters; and
   a scattering layer is disposed between the light-emitting substrate and the photoresist layer;
   an encapsulation film layer is disposed between the light-emitting substrate and the scattering layer for the light entering the scattering layer through the encapsulation film layer, to reduce an incident angle of the light entering the scattering layer;
   wherein light emitted by the light-emitting substrate passes through the scattering layer and exits from the light regions and external light passing through the light regions that is refracted and/or reflected by the scattering layer is absorbed by the black matrices;
   wherein the light-emitting substrate comprises a plurality of sub-pixels of a plurality of organic light emitting diode (OLED) devices, each of the light regions are disposed opposite to one of the sub-pixels of the OLED devices, and the color of the sub-pixels disposed opposite to the light regions is the same as the color of the color filters corresponding to the light regions;
   wherein the encapsulation film layer comprises a plurality of sub-encapsulation film layers, and one of the sub-encapsulation film layers is disposed opposite to one of the sub-pixels of the OLED devices;
   wherein the horizontal width of the one of the sub-encapsulation film layers is the same as the horizontal width of the sub-pixel of the OLED device.

2. The display panel according to claim 1,
   wherein a refractive index of the color filter is greater than a refractive index of the scattering layer and the refractive index of the scattering layer is greater than a refractive index of the encapsulation film layer, such that the light sequentially passes through the encapsulation film layer, the scattering layer, and the light regions of the color filter, and exits from the light regions.

3. The display panel according to claim 2, wherein the encapsulation film layer is composed of silicon oxynitride.

4. The display panel according to claim 1,
   wherein the color of the sub-pixels of the OLED devices comprises three colors of red, green, and blue, and the color of the color filters corresponding to the light regions is one of the three colors of red, green, and blue.

5. The display panel according to claim 1, wherein a water/oxygen barrier layer is disposed between the sub-encapsulation film layers for blocking water and oxygen from entering the display panel.

6. A mobile device, comprising a housing and a display panel, the display panel mounted on the housing, the display panel comprising: a light-emitting substrate; a photoresist layer disposed on the light-emitting substrate wherein the photoresist layer comprises a plurality of color filters and a plurality of black matrices, the color filters and the black matrices are arranged alternately for forming a plurality of light regions on the color filters;
   a scattering layer is disposed between the light-emitting substrate and the photoresist layer; and
   an encapsulation film layer is disposed between the light-emitting substrate and the scattering layer for the light entering the scattering layer through the encapsulation film layer, to reduce an incident angle of the light entering the scattering layer;
   wherein light emitted by the light-emitting substrate passes through the scattering layer and exits from the light regions, and external light passing through the light regions, refracted and/or reflected by the scattering layer, is absorbed by the black matrices;
   wherein the light-emitting substrate comprises a plurality of sub-pixels of a plurality of organic light emitting diode (OLED) devices, each of the light regions are disposed opposite to one of the sub-pixels of the OLED devices, and the color of the sub-pixels disposed opposite to the light regions is the same as the color of the color filters corresponding to the light regions;

wherein the encapsulation film layer comprises a plurality of sub-encapsulation film layers, and one of the sub-encapsulation film layers is disposed opposite to one of the sub-pixels of the OLED devices;

wherein a water/oxygen barrier layer is disposed between the sub-encapsulation film layers for blocking water and oxygen from entering the display panel.

7. The mobile device according to claim 6, wherein a refractive index of the color filter is greater than a refractive index of the scattering layer and the refractive index of the scattering layer is greater than a refractive index of the encapsulation film layer, such that the light sequentially passes through the encapsulation film layer, the scattering layer, and the light regions of the color filter, and exits from the light regions.

8. The mobile device according to claim 7, wherein the encapsulation film layer is composed of silicon oxynitride.

9. The mobile device according to claim 6, wherein the color of the sub-pixels of the OLED devices comprises three colors of red, green, and blue, and the color of the color filters corresponding to the light regions is one of the three colors of red, green, and blue.

10. A display panel, comprising:

a light-emitting substrate; and a photoresist layer disposed on the light-emitting substrate wherein the photoresist layer comprises a plurality of color filters and a plurality of black matrices, the color filters and the black matrices are arranged alternately for forming a plurality of light regions on the color filters; and a scattering layer is disposed between the light-emitting substrate and the photoresist layer;

wherein light emitted by the light-emitting substrate passes through the scattering layer and exits from the light regions, and external light passing through the light regions, refracted and/or reflected by the scattering layer, is absorbed by the black matrices;

wherein an encapsulation film layer is disposed between the light-emitting substrate and the scattering layer for the light entering the scattering layer through the encapsulation film layer, to gradually reduce an incident angle of the light entering the encapsulation film layer, of the light entering the scattering layer, and of the light entering the photoresist layer, wherein light emitted by the light-emitting substrate sequentially enters the encapsulation film layer, the scattering layer, and the photoresist layer;

wherein the light-emitting substrate comprises a plurality of sub-pixels of a plurality of organic light emitting diode (OLED) devices, each of the light regions are disposed opposite to one of the sub-pixels of the OLED devices, and the color of the sub-pixels disposed opposite to the light regions is the same as the color of the color filters corresponding to the light regions;

wherein the encapsulation film layer comprises a plurality of sub-encapsulation film layers, and one of the sub-encapsulation film layers is disposed opposite to one of the sub-pixels of the OLED devices;

wherein a water/oxygen barrier layer is disposed between the sub-encapsulation film layers for blocking water and oxygen from entering the display panel.

* * * * *